United States Patent
Kang et al.

(10) Patent No.: US 8,228,466 B2
(45) Date of Patent: Jul. 24, 2012

(54) COLOR FILTER ARRAY PANEL AND METHOD FOR FABRICATING THE SAME

(75) Inventors: Dong Woo Kang, Gyeongsangbuk-do (KR); So Jong Shin, Gyeongsangbuk-do (KR); Bong Chul Kim, Daegu (KR); Ki Soub Yang, Gyeongsangbuk-do (KR); Tae Hyung Lee, Daegu (KR); Hak Woon Kim, Gyeongsangbuk-do (KR); Hong Myeong Jeon, Gyeongsangbuk-do (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 13/082,013

(22) Filed: Apr. 7, 2011

(65) Prior Publication Data
US 2011/0181819 A1     Jul. 28, 2011

Related U.S. Application Data

(62) Division of application No. 11/902,060, filed on Sep. 18, 2007, now Pat. No. 7,940,356.

(30) Foreign Application Priority Data

Sep. 18, 2006 (KR) .................. 10-2006-0090227

(51) Int. Cl.
*G02F 1/1333*     (2006.01)
*G02F 1/1335*     (2006.01)
(52) U.S. Cl. ............. 349/110; 349/106; 349/187
(58) Field of Classification Search ........ 349/106, 349/110, 187
See application file for complete search history.

(56) References Cited

U.S. PATENT DOCUMENTS

| 2004/0017527 | A1 | 1/2004 | Ryu |
| 2006/0232729 | A1* | 10/2006 | Rho ............... 349/106 |
| 2007/0172969 | A1* | 7/2007 | Wong et al. .......... 438/22 |

* cited by examiner

*Primary Examiner* — Nathanael R Briggs
(74) *Attorney, Agent, or Firm* — Morgan, Lewis & Bockius LLP

(57) ABSTRACT

A liquid crystal display comprises a matrix pattern formed in a double layer comprising a lower pattern having a hydrophilic property on a substrate, and a black matrix having a hydrophobic property on the lower pattern; and color filters formed in the pixel area.

8 Claims, 5 Drawing Sheets

COLOR FILTER ARRAY PANEL AND METHOD FOR FABRICATING THE SAME

This application is a Divisional of U.S. patent application Ser. No. 11/902,060 filed Sep. 18, 2007 now U.S. Pat. No. 7,940,356 and claims priority to Korean Patent Application No. 10-2006-090227, filed on Sep. 18, 2006, both of which are hereby incorporated by reference in their entirety.

BACKGROUND OF THE INVENTION

1. Field of the Invention

The embodiment relates to a liquid crystal display.

2. Background of the Related Art

Since a liquid crystal display is suitable for electronic appliances having tendency toward the light weight, slim structure, and small size, and the productivity of the liquid crystal display has been improved, the liquid crystal display has been quickly substituted for a cathode ray tube in various application fields.

Such a liquid crystal display has a structure in which a thin film transistor (TFT) array substrate provided with a thin film transistor (TFT) and a pixel electrode and a color filter substrate provided with a color filter layer are coupled with each other while interposing a liquid crystal layer therebetween.

In particular, the color filter substrate is fabricated in such a manner that pixel areas are defined by a black matrix in the form of a lattice and red, green, and blue color filters are formed on the pixel areas. The red, green, and blue color filters are formed by sequentially coating red, green, and blue resin on a substrate, and performing a mask process after each coating step.

In general, color resin includes hydrophilic material, and black matrix includes hydrophobic material, such that the color resin can be uniformly coated on the pixel area. However, if the hydrophobic material remains in the process of forming the black matrix, the color resin may be not formed with a uniform thickness.

In addition, the hydrophobic material for blocking light may exist in the pixel area, so that color purity of the color filter may be degraded.

If the color of the color filter is degraded by the hydrophobic material remaining in the pixel area, or the color filter is irregularly formed, the image quality of the liquid crystal display may be degraded.

SUMMARY OF THE INVENTION

The embodiment provides a liquid crystal display and a method for manufacturing the same, capable of uniformly spreading color ink in a pixel area.

According to the embodiment, a liquid crystal display includes a matrix pattern formed in a double layer including a lower pattern having a hydrophilic property on a substrate, and a black matrix having a hydrophobic property on the lower pattern; and color filters formed in the pixel area.

According to the embodiment, a method for manufacturing a liquid crystal display according to the embodiment, includes the steps of sequentially forming a hydrophilic photosensitive material layer and an opaque hydrophobic photosensitive material layer on a substrate; forming a matrix pattern dividing a pixel area by performing an exposure and development process with respect to the hydrophilic photosensitive material layer and the opaque hydrophobic photosensitive material layer; and forming a color filter on the pixel area.

According to the embodiment, a method for manufacturing a liquid crystal display, includes the steps of forming a hydrophilic photosensitive material layer and an opaque hydrophobic photosensitive material layer on a substrate; forming a matrix pattern dividing a pixel area by exposing the hydrophilic photosensitive material layer and the opaque hydrophobic photosensitive material layer through a mask process, developing the opaque hydrophobic photosensitive material layer, and then developing the hydrophilic photosensitive material layer; and forming a color filter on the pixel area through an ink-jet scheme.

According to the embodiment, a liquid crystal display includes a matrix pattern formed in a double layer including a lower pattern having a hydrophilic property on a substrate, and a black matrix having a hydrophobic property on the lower pattern; a color filter substrate comprising color filters formed in the pixel area; an array substrate corresponding to the color filter substrate, and comprising a pixel electrode and a thin film transistor; and a liquid crystal layer interposed between the color filter substrate and the array substrate.

According to the embodiment, a method for manufacturing a liquid crystal display, includes the steps of sequentially forming a hydrophilic photosensitive material layer and an opaque hydrophobic photosensitive material layer on a substrate; forming a matrix pattern dividing a pixel area by performing an exposure and development process with respect to the hydrophilic photosensitive material layer and the opaque hydrophobic photosensitive material layer; forming a color filter substrate by forming a color filter on the pixel area; providing an array substrate corresponding to the color filter substrate, and comprising a pixel electrode and a thin film transistor; and interposing a liquid crystal layer between the color filter substrate and the array substrate.

DETAILED DESCRIPTION OF THE PREFERRED EMBODIMENTS

Any reference in this specification to "one embodiment," "an embodiment," "example embodiment," etc., means that a particular feature, structure, or characteristic described in connection with the embodiment is included in at least one embodiment of the invention. The appearances of such phrases in various places in the specification are not necessarily all referring to the same embodiment. Further, when a particular feature, structure, or characteristic is described in connection with any embodiment, it is submitted that it is within the purview of one skilled in the art to effect such feature, structure, or characteristic in connection with other ones of the embodiments.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

Hereinafter, preferred embodiments will be described with reference to FIGS. 1 to 2G.

Figure 1:
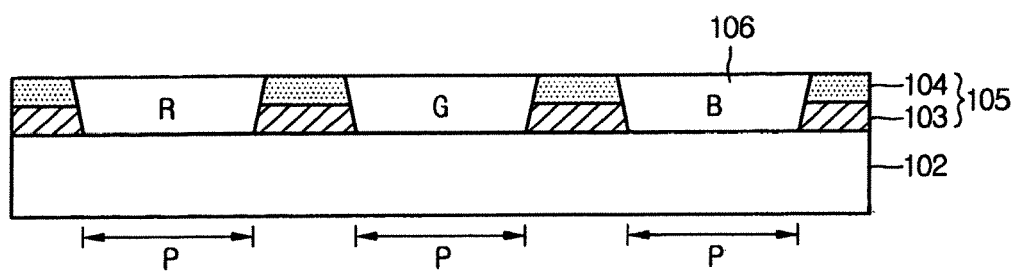
FIG. 1 is a sectional view showing a color filter substrate according to the embodiment.

FIG. 1 is a sectional view showing a color filter substrate according to the embodiment.

Referring to FIG. 1, the color filter substrate includes matrix patterns 105 and color filters 106 sequentially formed on a substrate 102. In addition, the color filter array panel includes a planar layer on the substrate 102 formed with the color filter 106 if necessary, or a common electrode according to a liquid crystal mode.

The matrix patterns 105 are provided on the substrate 102 in the form of a mesh such that a plurality of pixel areas for the color filters 106 can be formed. In addition, the matrix patterns 105 have lower patterns 103 with a hydrophilic photosensitive material and black matrix 104, which are stacked on the lower patterns 103, including an opaque hydrophobic photosensitive material.

In this case, the lower pattern 103 of the matrix pattern 105 has a hydrophilic property. In other words, even if the residue of the lower pattern 103 exits in a pixel area P due to the process of forming the matrix pattern 105, the lower pattern 103 has the same property (hydrophilic property) as that of a color ink used in the following process. In detail, after coating a hydrophilic material constituting the lower pattern 103 on the substrate 102 through a spin coating scheme, or a slit coating scheme, a hydrophobic material constituting the black matrix 104 is formed on the hydrophilic material through a spin coating scheme, or the slit coating scheme. When the hydrophilic material and the hydrophobic material stacked on the hydrophilic material are patterned, the hydrophobic material and the hydrophilic material are removed from the pixel area P. As a result, the residue of the hydrophobic material does not remain in the pixel area P. In addition, even if the residue of the hydrophilic material is not removed from the substrate 104, but remains, the hydrophilic material does not prevent color ink having a hydrophilic property from being uniformly spread on the pixel area P. Accordingly, the color filter 106 may be uniformly formed in the pixel area P. Detailed description about the manufacturing process of the matrix pattern 104 and the color filter 106 will be described below with reference to FIGS. 2A to 2G.

Since the black matrix 104 of the matrix pattern 105 includes an opaque material, the black matrix 104 prevents light interference between adjacent pixels. In addition, since the black matrix 104 of the matrix pattern 105 includes a hydrophobic material, the black matrix 104 prevents color ink having a hydrophilic property from overflowing into an adjacent pixel area P so that the color ink can be prevented from being mixed with color ink having other color.

The color filters 106 are formed on pixel areas divided by the matrix pattern 104 through an ink-jetting scheme. The color filters 106 are formed by red(R), green(G), and blue(B) hydrophilic color ink so that red (R), green(G), and blue(B) colors are realized.

FIGS. 2A to 2G are sectional views showing the manufacturing process of the color filter substrate according to the embodiment.

Figure 2A:
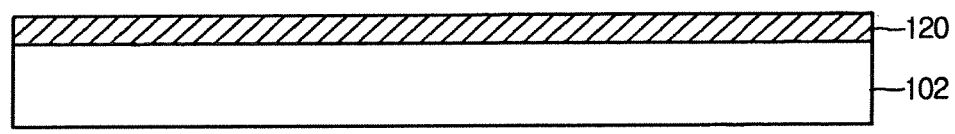
FIGS. 2A to 2G are sectional views showing a method for fabricating a color filter substrate according to the embodiment.

As shown in FIG. 2A, a hydrophilic photosensitive material 120 is formed on the substrate 101. The hydrophilic photosensitive material 120 includes photoresist. In addition, the hydrophilic photosensitive material 120 may have one of red(R), green (G), and blue (B). More preferably, the hydrophilic photosensitive material 120 has a transparent color, so that the hydrophilic photosensitive material 120 does not change the color of the color filter, which is formed later in the pixel area P, even if the photosensitive material 120 having the hydrophilic property remains in the pixel area P.

Figure 2B:
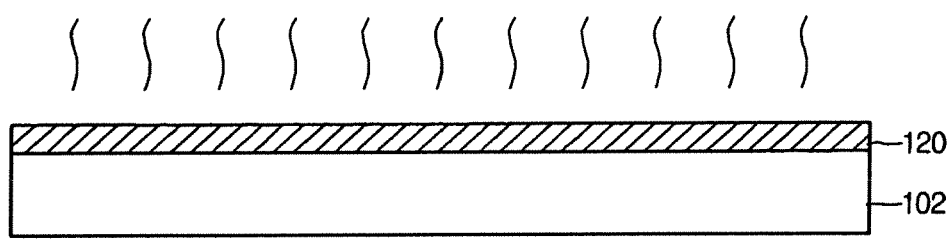
Figure 2C:
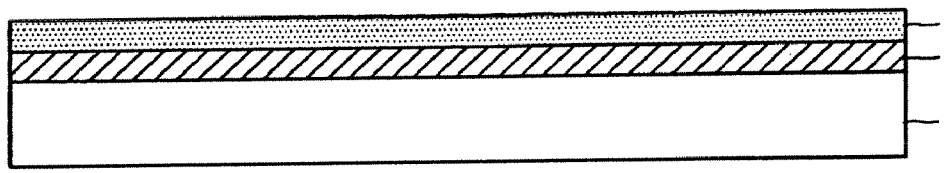
Figure 2D:
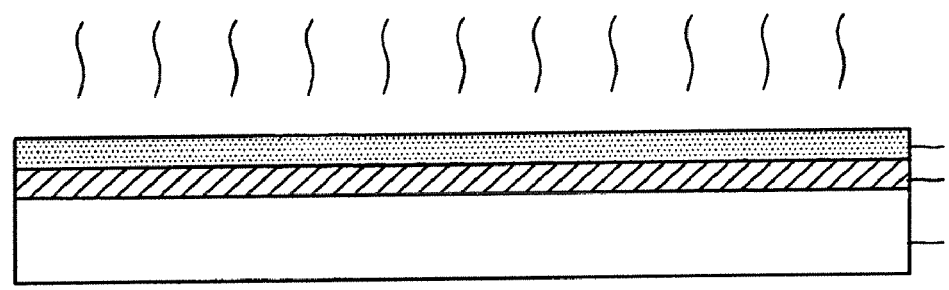

Thereafter, as shown in FIG. 2B, the hydrophilic photosensitive material 120 is hardened through a baking process at a temperature in the range of 90° to 120°. As shown in FIG. 2C, the opaque hydrophobic photosensitive material 130 is formed on the hydrophilic photosensitive material 120. The opaque hydrophobic photosensitive material 130 includes opaque photoresist.

The hydrophobic photosensitive material 130 is hardened through a baking process at a temperature in a range of 90° to 120°.

Figure 2E:
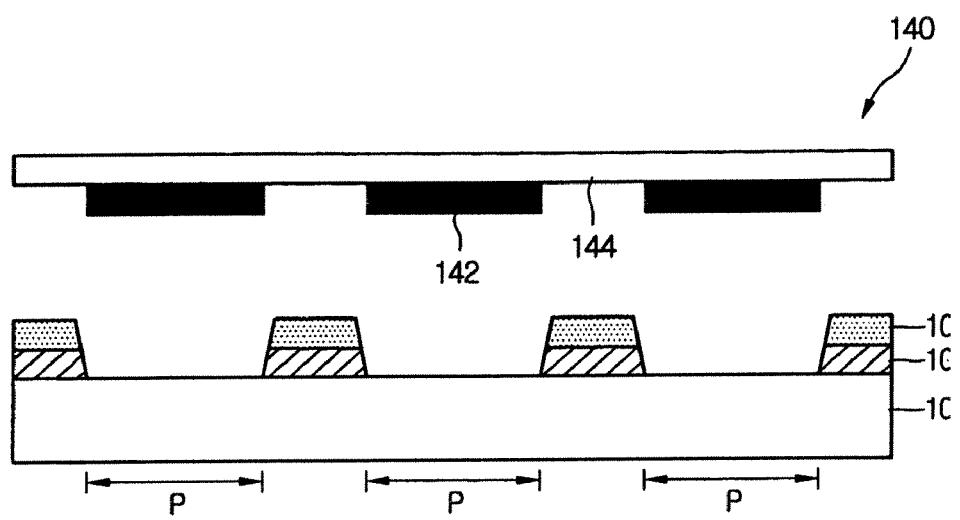

Thereafter, as shown in FIG. 2E, an exposure mask 140 is disposed at the upper portion of the substrate 102. The exposure mask 140 includes an exposing area 144 of transmitting light and a blocking area 142 of blocking light. The parts of the photosensitive materials 120 and 130 corresponding to the exposing area 144 and the blocking area 142 are varied according to the type of the photosensitive materials 120 and 130. Hereinafter, negative photosensitive materials 120 and 130 will be representatively described. If the negative photosensitive materials 120 and 130 are employed, the blocking area 142 of the exposure mask 140 corresponds to a part of the pixel area P, and the exposing area 144 corresponds to a part the matrix pattern 105. Then, the photosensitive materials 120 and 130 are removed from the pixel area P through the exposure and development process. Regarding detailed description of the development process, after the opaque hydrophobic photosensitive material 130 is removed from the pixel area P, the hydrophilic photosensitive material 120 formed at the lower portion of the opaque hydrophobic photosensitive material 130 is removed. Accordingly, the opaque hydrophobic photosensitive material 130 can be completely removed from the pixel area P.

Figure 2F:
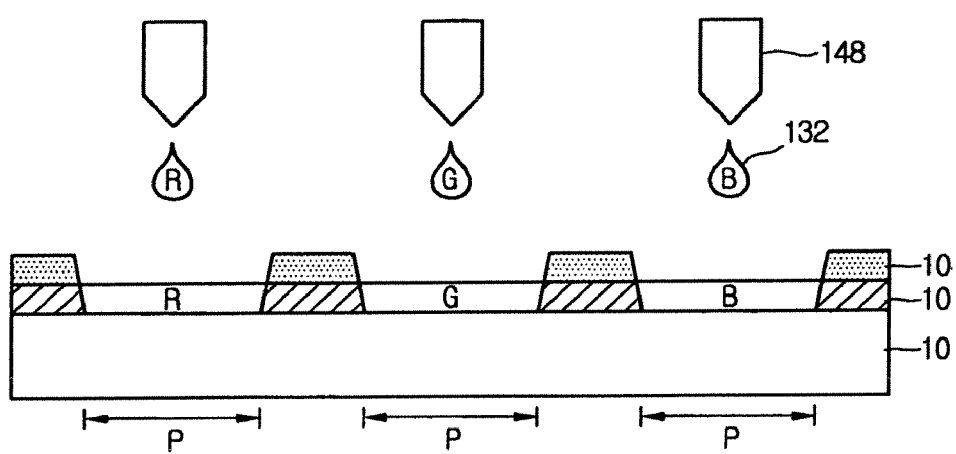

As shown in FIG. 2F, ink-jet devices 148 are arranged on the substrate 106 formed with the matrix patterns 105. The ink-jet devices 148 spray corresponding color ink 132 on the red (R), green(G), and blue (B) pixel areas P. In this case, the color ink 132 has a hydrophilic property. Even if the residue of the photoresist material 120 exists in the pixel area P during the development process shown in FIG. 2E, the residue of the photosensitive material 120 becomes not a factor of preventing the color ink 132 having the hydrophilic property from being uniformly spread in the pixel areas P.

Figure 2G:
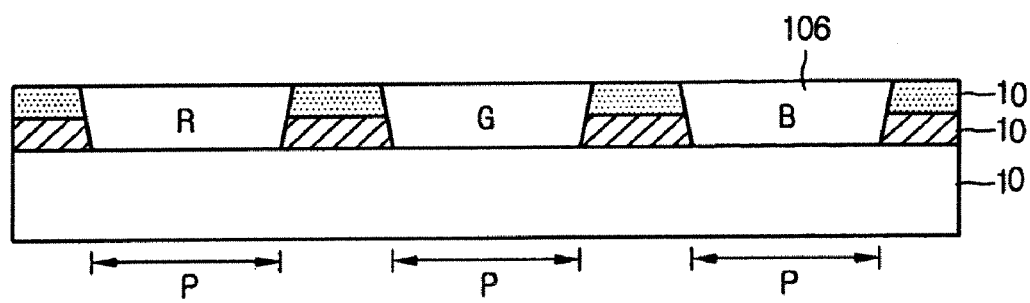

Thereafter, as the color ink 132 sprayed in the pixel area P is hardened, red(R), green(G), and blue(B) color filters 106 are formed in the pixel areas P as shown in FIG. 2G. A planar layer may be formed on the substrate 102 formed with the color filters 106 if necessary. In addition, a common electrode may be formed on the substrate 102 according to liquid crystal modes.

As described above, in a color filter array panel and a method for fabricating the same according to the embodiment, a lower pattern having the same hydrophilic material as that of color ink is provided on the lower portion of a black matrix, thereby preventing the hydrophobic material from remaining on a substrate. Accordingly, in the color filter array panel and a method for fabricating the same according to the embodiment, the hydrophobic material does not remain on the substrate, so that the color ink is uniformly spread on a pixel area.

Figure 3:
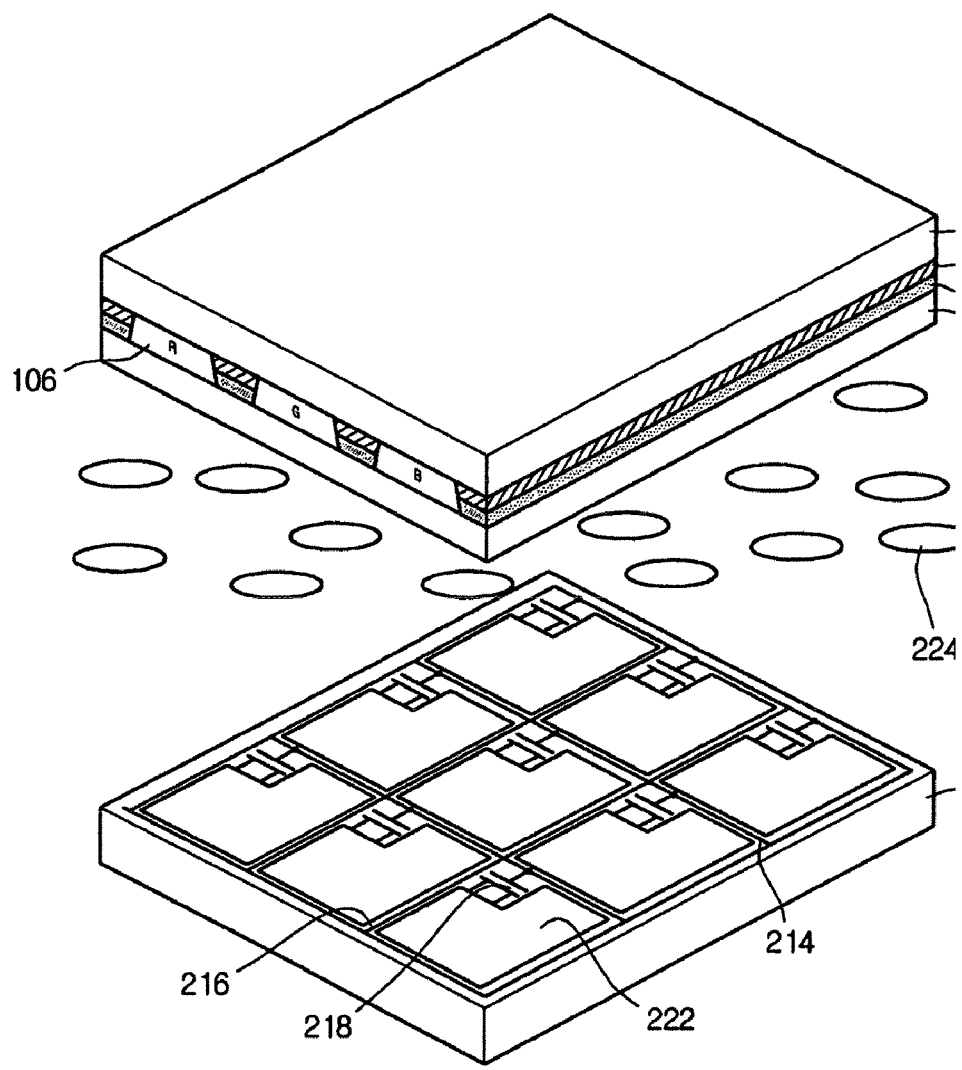
FIG. 3 is a view showing a liquid crystal display according to the embodiment.

FIG. 3 is a view showing a liquid crystal display according to the embodiment.

Referring to FIG. 3, in the liquid crystal display, a color filter substrate 200, which is manufactured according to a manufacturing process shown in FIGS. 2A to 2G, and an array substrate 300, which is provided with a thin film transistor (TFT) 218 and a pixel electrode 222, are bonded to each other while interposing a liquid crystal layer 224 therebetween.

The color filter substrate 200 includes a pixel area divided in the matrix pattern 105 including the lower pattern 103 having hydrophilic material and the black matrix 104 having hydrophobic material on the substrate 102. The pixel area is formed with the red, green, and blue color filters 106. A common electrode 208, which includes transparent conductive material, is formed on the substrate 102 having the color filter 106. However, when the common electrode 208 is formed on the array substrate 300 in a mode such as an in-switching (IPS) mode, or a fringe field switching (FFS) mode, the common electrode 208 is not formed on the color filter substrate 200.

In addition, an overcoat layer (not shown) may be additionally formed between the color filter 106 and the common electrode 208 in order to planarize the color filter 106.

When the color filter substrate 200 is completely manufactured as described above, the color filter substrate 200 and the array substrate 300 are bonded to each other while interposing the liquid crystal layer 224 therebetween, thereby manufacturing the liquid crystal display.

Reference numbers 214, 216, and 212, which are not described even through shown in drawings, represent a gate line, a data line, and a lower substrate, respectively.

The thin film transistor 218 applies a data signal from the data line 216 to the pixel electrode 222 in response to a gate signal from the gate line 212. The pixel electrode 222 including a transparent conductive layer applies a data signal from the thin film transistor 218 so as to drive the liquid crystal layer 224.

Liquid crystals having dielectric anisotropy are rotated according to an electric field created by a data signal of the pixel electrode 222 and common voltage Vcom of the common electrode 208, so as to adjust light transmittance, thereby realizing gray scales.

It will be apparent to those skilled in the art that various modifications and variations can be made in the present invention. Thus, it is intended that the present invention covers the modifications and variations thereof within the scope of the appended claims.

What is claimed is:

1. A liquid crystal display comprising:
   a matrix pattern formed in a double layer comprising a lower pattern having a hydrophilic property on a substrate, and a black matrix having a hydrophobic property on the lower pattern; and
   color filters formed in a pixel area, and
   wherein a common electrode is formed on the substrate and an overcoat layer is further formed between the color filters and the common electrode, and
   wherein each of the both sides of the black matrix is at the same plane with each of the both sides of the lower pattern.

2. The liquid crystal display as claimed in claim 1, wherein the color filters comprise red, green, and blue hydrophilic color ink.

3. The liquid crystal display as claimed in claim 2, wherein the lower pattern comprises hydrophilic photoresist.

4. The liquid crystal display as claimed in claim 3, wherein the hydrophilic photoresist comprises one selected from among red, green, and blue colors.

5. The liquid crystal display as claimed in claim 3, wherein the hydrophilic photoresist is transparent.

6. The liquid crystal display as claimed in claim 3, wherein the black matrix comprises hydrophobic black photoresist.

7. The liquid crystal display as claimed in claim 1, further comprising a common electrode comprising transparent conductive material on the substrate formed with the color filters.

8. The liquid crystal display as claimed in claim 1, wherein the lower pattern and the black matrix is formed by sequentially removing stacked material layers corresponding to each of the lower pattern and the black matrix at the pixel area.

* * * * *